US010559482B2

(12) United States Patent
Ito

(10) Patent No.: US 10,559,482 B2
(45) Date of Patent: Feb. 11, 2020

(54) HEAT TREATMENT METHOD OF LIGHT IRRADIATION TYPE

(71) Applicant: SCREEN HOLDINGS CO., LTD., Kyoto-shi, Kyoto (JP)

(72) Inventor: Yoshio Ito, Kyoto (JP)

(73) Assignee: SCREEN HOLDINGS CO., LTD., Kyoto (JP)

(*) Notice: Subject to any disclaimer, the term of this patent is extended or adjusted under 35 U.S.C. 154(b) by 24 days.

(21) Appl. No.: 15/907,245

(22) Filed: Feb. 27, 2018

(65) Prior Publication Data
US 2018/0261477 A1 Sep. 13, 2018

(30) Foreign Application Priority Data
Mar. 9, 2017 (JP) ................................. 2014-045053

(51) Int. Cl.
*H01L 21/31* (2006.01)
*H01L 21/67* (2006.01)
(Continued)

(52) U.S. Cl.
CPC .... *H01L 21/67115* (2013.01); *H01L 21/2253* (2013.01); *H01L 21/68757* (2013.01)

(58) Field of Classification Search
CPC . B29C 66/71; B29C 66/7212; B29C 65/1406; B29C 65/1412; B29C 65/1425;
(Continued)

(56) References Cited

U.S. PATENT DOCUMENTS

2002/0155669 A1* 10/2002 Jacobson .......... H01L 21/28556
438/308
2011/0202115 A1* 8/2011 Kinoshita ............ A61N 5/0617
607/88
(Continued)

FOREIGN PATENT DOCUMENTS

JP 2010-225645 A 10/2010
JP 2017-017275 A 1/2017
(Continued)

OTHER PUBLICATIONS

Taiwanese Office Action issued in corresponding Taiwanese Patent Application No. 107103634, dated Nov. 12, 2018, with English Translation of the Japanese Translation of the Taiwanese Office Action.
(Continued)

*Primary Examiner* — Robert G Bachner
(74) *Attorney, Agent, or Firm* — McDermott Will & Emery LLP

(57) ABSTRACT

In a state where nothing is held on a quartz susceptor provided in a chamber, a lower chamber window made of quartz is heated to and maintained at a stable temperature by light irradiation from a continuous lighting lamp. Then, immediately before a semiconductor wafer to be treated is transferred into the chamber, an object to be heated that absorbs infrared light is held on the susceptor, and the object to be heated is heated by light irradiation from the continuous lighting lamp. The susceptor is preliminary heated to a stable temperature by the heated object to be heated. The lower chamber window and the susceptor are each heated to the stable temperature when a semiconductor wafer to be treated first is transferred into the chamber, so that temperature histories of all semiconductor wafers constituting one lot can be made uniform. This enables dummy running,
(Continued)

before a semiconductor wafer to be treated first is transferred, to be eliminated.

3 Claims, 10 Drawing Sheets

(51) Int. Cl.
*H01L 21/687* (2006.01)
*H01L 21/225* (2006.01)

(58) Field of Classification Search
CPC .............. B29C 65/1435; B29C 65/148; B29C 65/3612; B29C 65/3636; B29C 65/3676; B29C 65/3696; B29C 66/3474; B29C 66/721; B29C 66/72141; B29C 66/72143; B29C 66/73772; B29C 66/73774; B29C 66/73776; B29C 66/73921; B29C 66/91411; B29C 66/91443; B29C 66/91931; B29C 66/91933; B29C 66/91935; B29C 66/91943; B29C 66/91945; B29C 66/91951; H01L 2924/0002; H01L 2924/00; H01L 29/045; H01L 29/0657; H01L 29/2003; H01L 29/34; H01L 33/16; H01L 21/76801; H01L 21/76808; H01L 21/76832; H01L 21/02274

See application file for complete search history.

(56) References Cited

U.S. PATENT DOCUMENTS

| | | |
|---|---|---|
| 2016/0336195 A1 | 11/2016 | Fuse |
| 2017/0011922 A1 | 1/2017 | Tanimura et al. |
| 2017/0011923 A1 | 1/2017 | Tanimura et al. |
| 2017/0053818 A1 | 2/2017 | Aoyama |

FOREIGN PATENT DOCUMENTS

| | | |
|---|---|---|
| KR | 10-2015-0045695 A | 4/2015 |
| TW | 201642323 A | 12/2016 |
| TW | 201705296 A | 2/2017 |
| TW | 201709336 A | 3/2017 |
| TW | 201709337 A | 3/2017 |

OTHER PUBLICATIONS

Korean Notification of Reason for Refusal issued in corresponding Korean Patent Application No. 10-2018-0023770, dated Aug. 13, 2019, with English Translation.

Taiwanese Office Action issued in corresponding Taiwanese Patent Application No. 108111754, dated Nov. 7, 2019, with the English translation of the Japanese translation of the Taiwanese Office Action.

* cited by examiner

F I G . 4
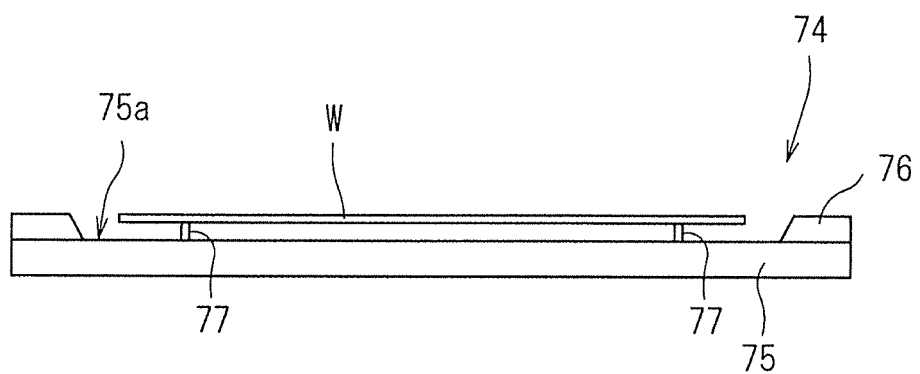

F I G. 5
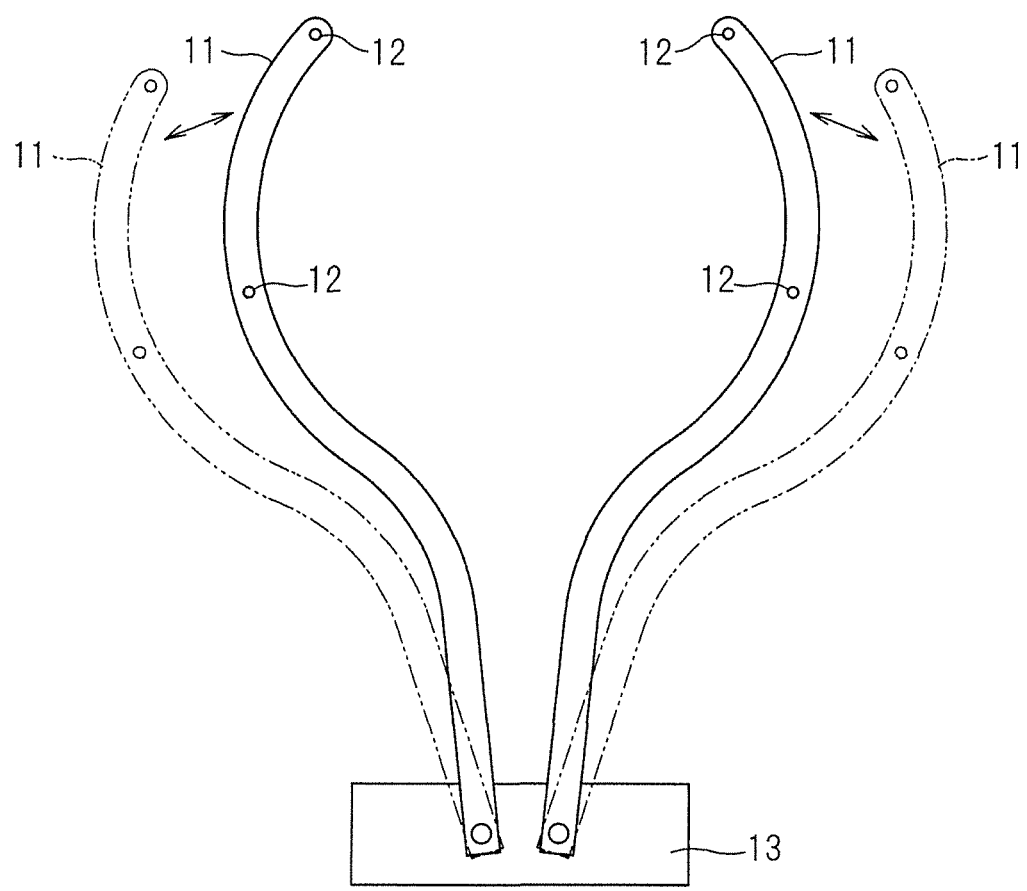

F I G. 7
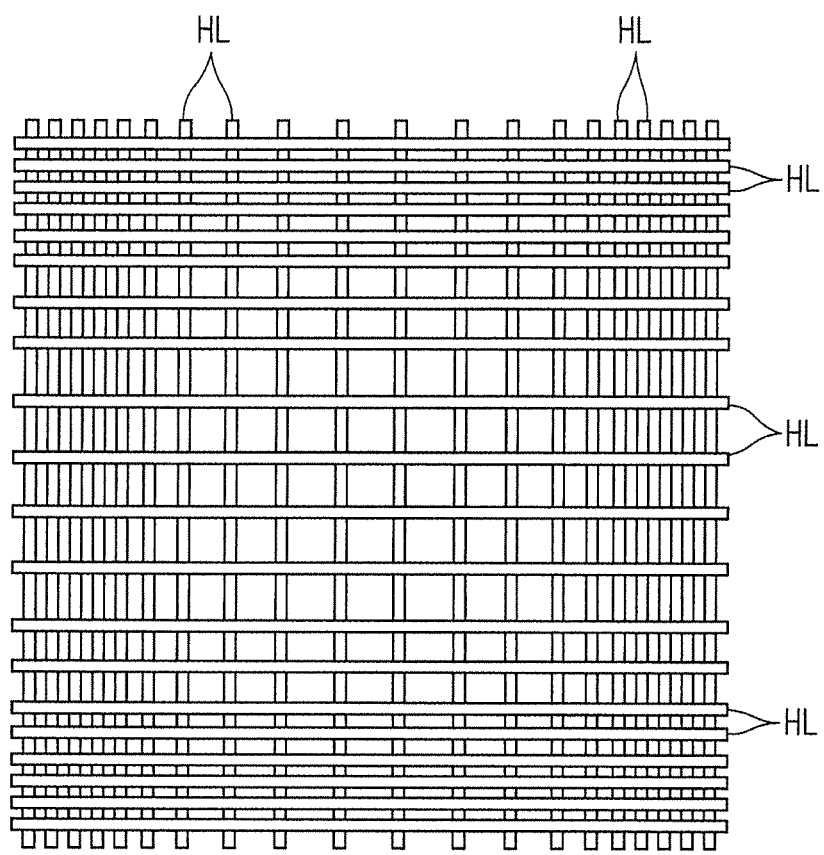

F I G. 9
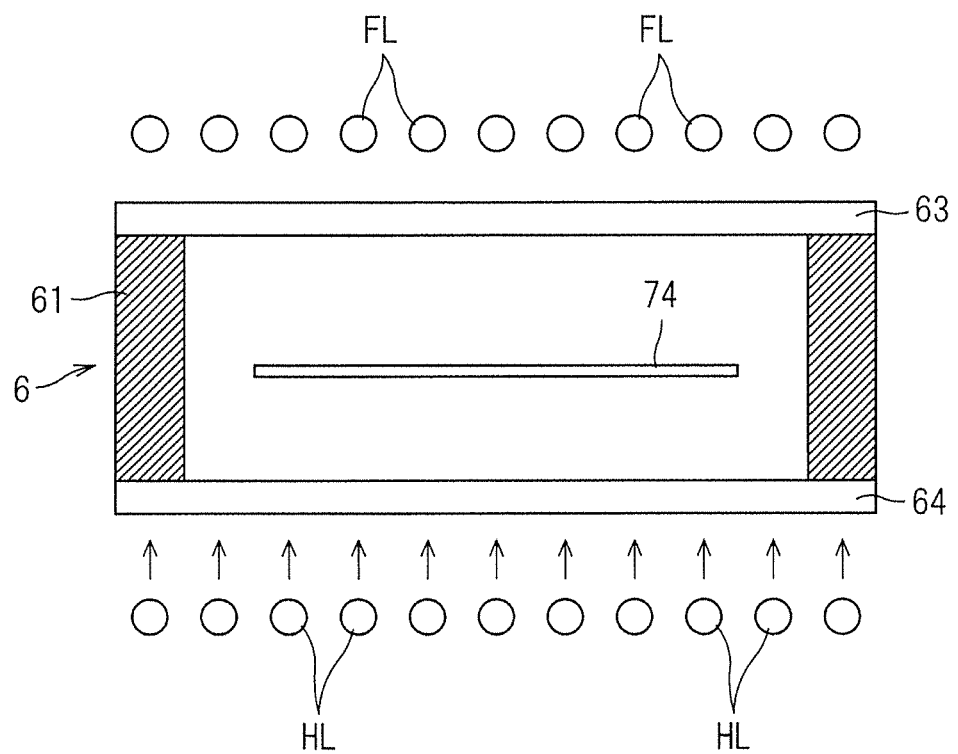

F I G . 1 0
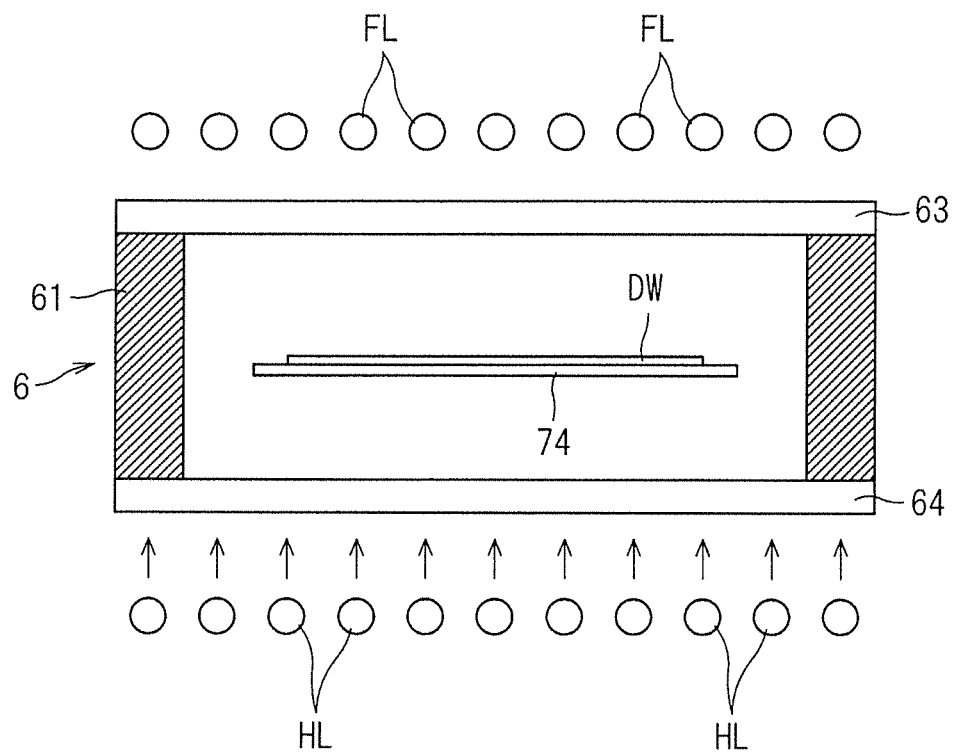

HEAT TREATMENT METHOD OF LIGHT IRRADIATION TYPE

BACKGROUND OF THE INVENTION

Field of the Invention

The present invention relates to a heat treatment method for irradiating a thin-plated precision electronic substrate (hereinafter referred to as simply a "substrate") such as a semiconductor wafer held on a quartz susceptor provided in a chamber with light from a continuous lighting lamp to heat the substrate.

Description of the Background Art

In a manufacturing process of semiconductor devices, impurity implant is an essential process to form a p-n junction in a semiconductor wafer. At present, impurity implant is typically performed by an ion implantation method followed by an annealing method. The ion implantation method is a technique for physically performing impurity implantation by ionizing elements of impurities, such as boron (B), arsenic (As), and phosphorus (P), and colliding them with a semiconductor wafer by using highly accelerated voltage. The impurities implanted are activated by annealing treatment. At the time, when annealing time is about a few seconds or more, implanted impurities are deeply diffused by heat. As a result, junction depth becomes too deeper than required depth, and this may hinder forming of a favorable device.

In recent years, flash lamp annealing (FLA) has been paid attention as an annealing technique for heating a semiconductor wafer for an extremely short time. The flash lamp annealing is a heat treatment technique for irradiating a surface of a semiconductor wafer with a flash of light by using a xenon flash lamp (hereinafter when referred to as simply a "flash lamp", it means a xenon flash lamp) to increase temperature of only the surface of a semiconductor wafer into which impurities are implanted in an extremely short time (milliseconds or less).

The xenon flash lamp has an emission spectroscopy distribution radiation from an ultraviolet part to a near-infrared part, and has a wavelength that is shorter than that of a conventional halogen lamp, and that almost coincides with that of a fundamental absorption band of a semiconductor wafer made of silicon. This causes transmitted light to decrease when the xenon flash lamp irradiates a semiconductor wafer with a flash of light, so that temperature of the semiconductor wafer can be sharply increased. It is also found that emission of a flash of light for an extremely short time of milliseconds or less enables only near a surface of a semiconductor wafer to be selectively increased in temperature. Thus, when temperature increases for an extremely short time by a xenon flash lamp, only impurity activation can be performed without diffusing impurities deeply.

As a heat treatment apparatus using a xenon flash lamp as described above, Japanese Patent Application Laid-Open No. 2010-225645 discloses a heat treatment apparatus in which a flash lamp is disposed on a front surface side of a semiconductor wafer, and a halogen lamp is disposed on a back surface side thereof, to perform desired heat treatment by combination of the lamps, for example. In the heat treatment apparatus disclosed in Japanese Patent Application Laid-Open No. 2010-225645, the halogen lamp preliminary heats a semiconductor wafer to some extent temperature, and then a front surface of the semiconductor wafer is increased in temperature to a desired treatment temperature by irradiation of flashes of light from the flash lamp.

In general, not only heat treatment but also treatment of a semiconductor wafer is performed per lot (a set of semiconductor wafers subjected to the same treatment under the same condition). In a single wafer processing substrate treatment apparatus, a plurality of semiconductor wafers constituting a lot is successively and sequentially treated. Also in a flash lamp annealing apparatus, a plurality of semiconductor wafers constituting one lot is transferred one by one into a chamber to be sequentially subjected to heat treatment.

When the flash lamp annealing apparatus in an operation stopped state starts treatment for one lot, the first semiconductor wafer of the lot is transferred into a chamber at approximately room temperature to be subjected to heating treatment. During the heating treatment, a semiconductor wafer supported by a susceptor in a chamber is preliminary heated to a predetermined temperature, and then a surface of the wafer is further increased in temperature to a treatment temperature by flash heating. As a result, heat conduction occurs from the semiconductor wafer increased in temperature to a structure such as a susceptor in the chamber to increase also temperature of the susceptor and the like. Such an increase in temperature of the susceptor or the like with the heating treatment of the semiconductor wafer is continued for about several sheets from the beginning of the lot, and when about ten semiconductor wafers are heated, the temperature of the susceptor reaches a constant stable temperature. In other words, while the first semiconductor wafer of the lot is held on a susceptor at room temperature to be treated, the tenth and subsequent semiconductor wafers are held on the susceptor heated to a stable temperature to be treated.

This causes a problem that temperature histories of a plurality of semiconductor wafers constituting the lot become non-uniform. In particular, about several sheets of semiconductor wafers from the beginning of the lot are supported by a susceptor at a relatively low temperature, so that surface temperature during irradiation of flashes of light may not reach a treatment temperature. When a semiconductor wafer held on a susceptor at a low temperature is irradiated with a flash of light, wafer warpage may occur due to a temperature difference between the susceptor and the semiconductor wafer to result in breakage of the semiconductor wafer.

Thus, to preliminarily increase temperature of a structure in a chamber, such as a susceptor before treatment of one lot is started, conventionally, a dummy wafer to be untreated is transferred into the chamber and is held on a susceptor to be subjected to preliminary heating and flash heating treatment under the same conditions as the lot to be treated (dummy running). When the preliminary heating and the flash heating treatment are applied to about ten dummy wafers, the susceptor or the like reaches a stable temperature, and then the treatment of the first semiconductor wafer of the lot to be treated is started. This enables temperature histories of a plurality of semiconductor wafers constituting one lot to be uniform, as well as enables wafer warpage due to a temperature difference between a susceptor and a semiconductor wafer to be prevented.

Unfortunately, such dummy running not only consumes dummy wafers unrelated to treatment, but also takes considerable time to apply flash heating treatment to about ten dummy wafers, to cause a problem of preventing efficient operation of a flash lamp annealing apparatus.

SUMMARY OF THE INVENTION

The present invention is directed to a heat treatment method for irradiating a substrate held on a quartz susceptor provided in a chamber with light from a continuous lighting lamp provided outside the chamber to heat the substrate.

According to an aspect of the present invention, a heat treatment method includes the following steps: (a) keeping temperature of a quartz window provided in a chamber by light irradiation from the continuous lighting lamp; (b) holding an object to be heated that absorbs infrared light to increase in temperature on the susceptor before a substrate to be treated is transferred into the chamber so that the object to be heated is heated by light irradiation from the continuous lighting lamp to preliminary heat the susceptor; and (c) holding the substrate on the susceptor after the step (b) so that the substrate is heated by light irradiation from the continuous lighting lamp.

When a substrate to be treated is transferred into the chamber, temperature of the quartz window and the susceptor is increased, and thus dummy running can be eliminated.

When temperature of each of the quartz window and the susceptor increases to be constant by continuously irradiating a plurality of substrates of one lot with light to heat the substrates without heating the quartz window and the susceptor, the temperature of the quartz window and the temperature of the susceptor are indicated as a first stable temperature and a second stable temperature, respectively, and it is preferable that the quartz window be heated so that the temperature of the quartz window is maintained at the first stable temperature in the step (a), and the susceptor be heated so that the temperature of the susceptor reaches the second stable temperature in the step (b).

When a plurality of substrates to be treated is sequentially treated continuously, temperature histories can be uniform.

Thus, it is an object of the present invention to eliminate dummy running.

These and other objects, features, aspects and advantages of the present invention will become more apparent from the following detailed description of the present invention when taken in conjunction with the accompanying drawings.

BRIEF DESCRIPTION OF THE DRAWING

FIG. 4 is a sectional view of the susceptor;

FIG. 5 is a plan view of a transfer mechanism;

FIG. 7 is a plan view showing a placement of a plurality of halogen lamps;

FIG. 9 is a schematic diagram showing heating of a lower chamber window by halogen lamps; and FIG. 10 is a schematic diagram showing heating of a dummy wafer by halogen lamps.

DESCRIPTION OF THE PREFERRED EMBODIMENTS

Hereinafter, preferred embodiments of the present invention will be described in detail with reference to drawings.

Figure 1:
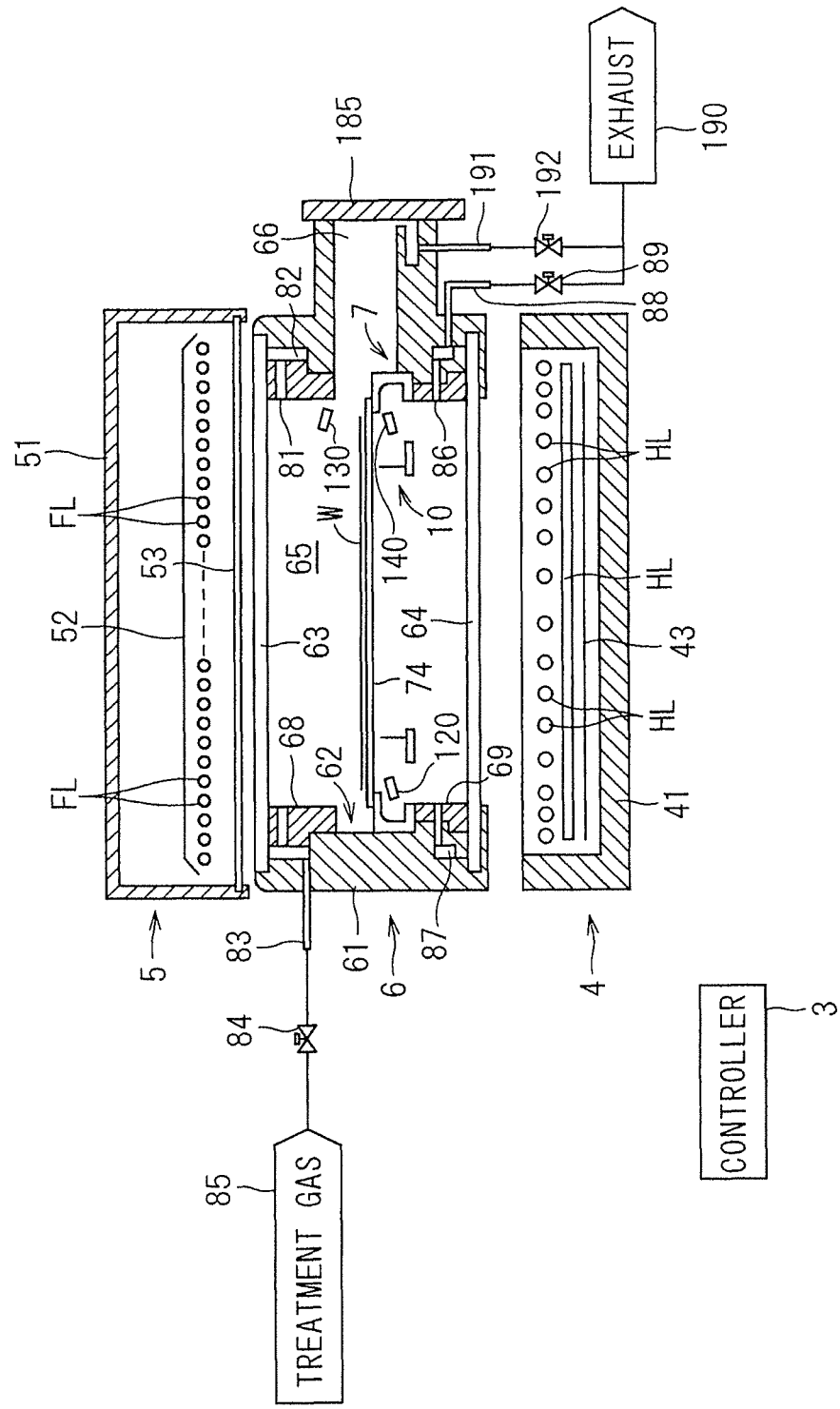
FIG. 1 is a longitudinal sectional view showing a configuration of a heat treatment apparatus used in a heat treatment method according to the present invention.

First, a heat treatment apparatus for performing a heat treatment method according to the present invention will be described. FIG. 1 is a longitudinal sectional view showing a configuration of a heat treatment apparatus 1 used in a heat treatment method according to the present invention. The heat treatment apparatus 1 of FIG. 1 is a flash lamp annealer apparatus for irradiating a disk-shaped semiconductor wafer W serving as a substrate with flashes of light to heat the semiconductor wafer W. Although a size of the semiconductor wafer W to be treated is not particularly limited, the semiconductor wafer W to be treated has a diameter of 300 mm or 450 mm, for example. It should be noted that the dimensions of components and the number of components are shown in exaggeration or in simplified manner, as appropriate, in FIG. 1 and the subsequent figures for the sake of easier understanding.

The heat treatment apparatus 1 includes a chamber 6 for accommodating a semiconductor wafer W, a flash heating unit 5 having a plurality of built-in flash lamps FL, and a halogen heating unit 4 having a plurality of built-in halogen lamps HL. The flash heating unit 5 is provided over the chamber 6, and the halogen heating unit 4 is provided under the chamber 6. The heat treatment apparatus 1 further includes inside the chamber 6 a holder 7 for holding a semiconductor wafer W in a horizontal attitude, and a transfer mechanism 10 for delivering a semiconductor wafer W between the holder 7 and the outside of the heat treatment apparatus 1. The heat treatment apparatus 1 further includes a controller 3 that controls an operating mechanism provided in each of the halogen heating unit 4, the flash heating unit 5, and the chamber 6 to apply heat treatment to a semiconductor wafer W.

The chamber 6 includes a tubular chamber side portion 61, and chamber windows made of quartz mounted on the top and bottom of the chamber side portion 61. The chamber side portion 61 has a substantially tubular shape with an open top and an open bottom. An upper chamber window 63 is mounted to block the open top of the chamber side portion 61, and a lower chamber window 64 is mounted to block the open bottom thereof. The upper chamber window 63 forming the ceiling of the chamber 6 is a disk-shaped member made of quartz, and serves as a quartz window that transmits flashes of light emitted from the flash heating unit 5 therethrough into the chamber 6. The lower chamber window 64 forming the floor of the chamber 6 is also a disk-shaped member made of quartz, and serves as a quartz window that transmits light emitted from the halogen heating unit 4 therethrough into the chamber 6.

The chamber 6 of the present preferred embodiment is a pressure reduction type capable of reducing pressure therein to less than the atmospheric pressure, so that the upper chamber window 63 and the lower chamber window 64 are made thicker than those of a normal pressure type to increase pressure resistance. For example, while a chamber window of a normal pressure type has a thickness of 8 mm, each of the upper chamber window 63 and the lower chamber window 64 of the present preferred embodiment has a thickness of 28 mm.

An upper reflective ring 68 is mounted to an upper portion of the inner wall surface of the chamber side portion 61, and a lower reflective ring 69 is mounted to a lower portion thereof. Both of the upper and lower reflective rings 68 and 69 are in the form of an annular ring. The upper reflective ring 68 is mounted by being inserted downwardly from the top of the chamber side portion 61. Meanwhile, the lower reflective ring 69 is mounted by being inserted upwardly from the bottom of the chamber side portion 61, and is fastened with screws (not shown). In other words, the upper and lower reflective rings 68 and 69 are detachably mounted to the chamber side portion 61. An interior space of the chamber 6, i.e. a space surrounded by the upper chamber window 63, the lower chamber window 64, the chamber side portion 61, and the upper and lower reflective rings 68 and 69, is defined as a heat treatment space 65.

A recessed portion 62 is defined in the inner wall surface of the chamber 6 by mounting the upper and lower reflective rings 68 and 69 to the chamber side portion 61. Specifically, there is defined the recessed portion 62 surrounded by a middle portion of the inner wall surface of the chamber side portion 61 where the reflective rings 68 and 69 are not mounted, a lower end surface of the upper reflective ring 68, and an upper end surface of the lower reflective ring 69. The recessed portion 62 is provided in the form of a horizontal annular ring in the inner wall surface of the chamber 6, and surrounds the holder 7 that holds a semiconductor wafer W. The chamber side portion 61 and the upper and lower reflective rings 68 and 69 are made of a metal material (e.g., stainless steel) with high strength and high heat resistance.

The chamber side portion 61 is provided with a transport opening (throat) 66 for the transfer of a semiconductor wafer W therethrough into and out of the chamber 6. The transport opening 66 is openable and closable by a gate valve 185. The transport opening 66 is connected in communication with an outer peripheral surface of the recessed portion 62. Thus, when the transport opening 66 is opened by the gate valve 185, a semiconductor wafer W is allowed to be transferred through the transport opening 66 and the recessed portion 62 into and out of the heat treatment space 65. When the transport opening 66 is closed by the gate valve 185, the heat treatment space 65 in the chamber 6 is an enclosed space.

At least one gas supply opening 81 for supplying a treatment gas therethrough into the heat treatment space 65 is provided in an upper portion of the inner wall of the chamber 6. The gas supply opening 81 is provided above the recessed portion 62, and may be provided in the upper reflective ring 68. The gas supply opening 81 is connected in communication with a gas supply pipe 83 through a buffer space 82 provided in the form of an annular ring inside the side wall of the chamber 6. The gas supply pipe 83 is connected to a treatment gas supply source 85. A valve 84 is inserted at some midpoint in the gas supply pipe 83. When the valve 84 is opened, the treatment gas is fed from the treatment gas supply source 85 to the buffer space 82. The treatment gas flowing into the buffer space 82 flows in a spreading manner within the buffer space 82 which is lower in fluid resistance than the gas supply opening 81, and is supplied through the gas supply opening 81 into the heat treatment space 65. Examples of the treatment gas usable herein include inert gases such as nitrogen gas ($N_2$), and reactive gases such as hydrogen ($H_2$) and ammonia ($NH_3$), or a mixed gas thereof can be used (nitrogen gas in the present preferred embodiment).

At least one gas exhaust opening 86 for exhausting a gas from the heat treatment space 65 is provided in a lower portion of the inner wall of the chamber 6. The gas exhaust opening 86 is provided below the recessed portion 62, and may be provided in the lower reflective ring 69. The gas exhaust opening 86 is connected in communication with a gas exhaust pipe 88 through a buffer space 87 provided in the form of an annular ring inside the side wall of the chamber 6. The gas exhaust pipe 88 is connected to an exhaust unit 190. A valve 89 is inserted at some midpoint in the gas exhaust pipe 88. When the valve 89 is opened, the gas in the heat treatment space 65 is exhausted through the gas exhaust opening 86 and the buffer space 87 to the gas exhaust pipe 88. The at least one gas supply opening 81 and the at least one gas exhaust opening 86 may include a plurality of gas supply openings 81 and a plurality of gas exhaust openings 86, respectively, arranged in a circumferential direction of the chamber 6, and each may be in the form of a slit.

A gas exhaust pipe 191 for exhausting the gas from the heat treatment space 65 is also connected to a distal end of the transport opening 66. The gas exhaust pipe 191 is connected through a valve 192 to the exhaust unit 190. When the valve 192 is opened, the gas in the chamber 6 is exhausted through the transport opening 66.

A vacuum pump and a utility exhaust system in a factory in which the treatment apparatus 1 is installed may be used as the exhaust unit 190. When a vacuum pump is employed as the exhaust unit 190 to exhaust the atmosphere provided in the heat treatment space 65 which is an enclosed space while no gas is supplied from the gas supply opening 81 by closing the valve 84, the atmosphere provided in the chamber 6 is reduced in pressure to a vacuum atmosphere. When the vacuum pump is not used as the exhaust part 190, the pressure of the atmosphere provided in the chamber 6 can be reduced to a pressure lower than atmospheric pressure by exhausting the atmosphere provided in the heat treatment space 65 while the gas is not supplied from the gas supply opening 81.

Figure 2:
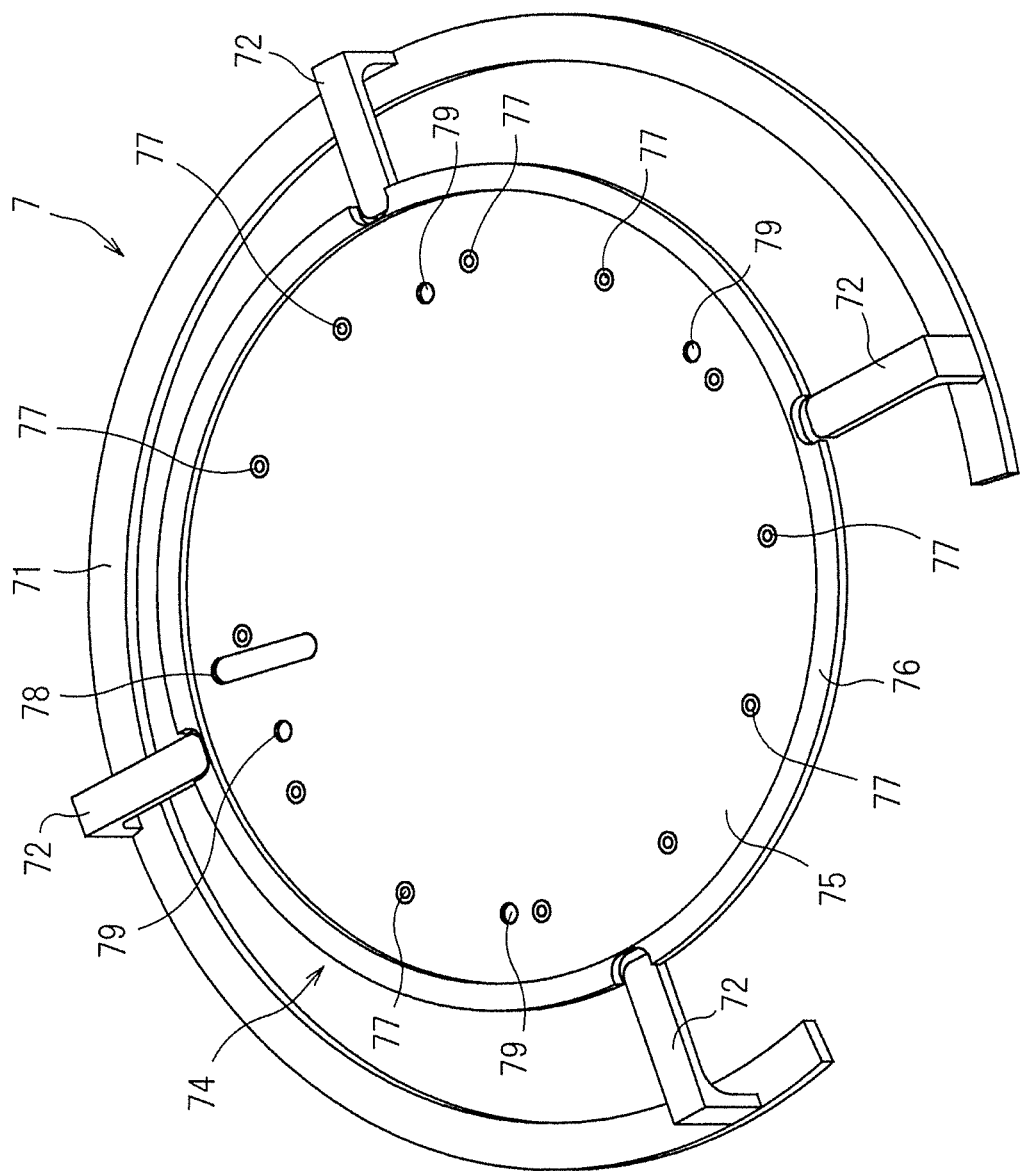
FIG. 2 is a perspective view showing an entire external appearance of a holder.

FIG. 2 is a perspective view showing the entire external appearance of the holder 7. The holder 7 includes a base ring 71, coupling portions 72, and a susceptor 74. The base ring 71, the coupling portions 72, and the susceptor 74 are all made of quartz. In other words, the whole of the holder 7 is made of quartz.

The base ring 71 is a quartz member having an arcuate shape obtained by removing a portion from an annular shape. This removed portion is provided to prevent interference between transfer arms 11 of the transfer mechanism 10 to be described later and the base ring 71. The base ring 71 is supported by the wall surface of the chamber 6 by being placed on the bottom surface of the recessed portion 62 (with reference to FIG. 1). The multiple coupling portions 72 (in the present preferred embodiment, four coupling portions 72) are mounted upright on the upper surface of the base ring 71 and arranged in a circumferential direction of the annular shape thereof. The coupling portions 72 are also quartz members, and are rigidly secured to the base ring 71 by welding.

Figure 3:
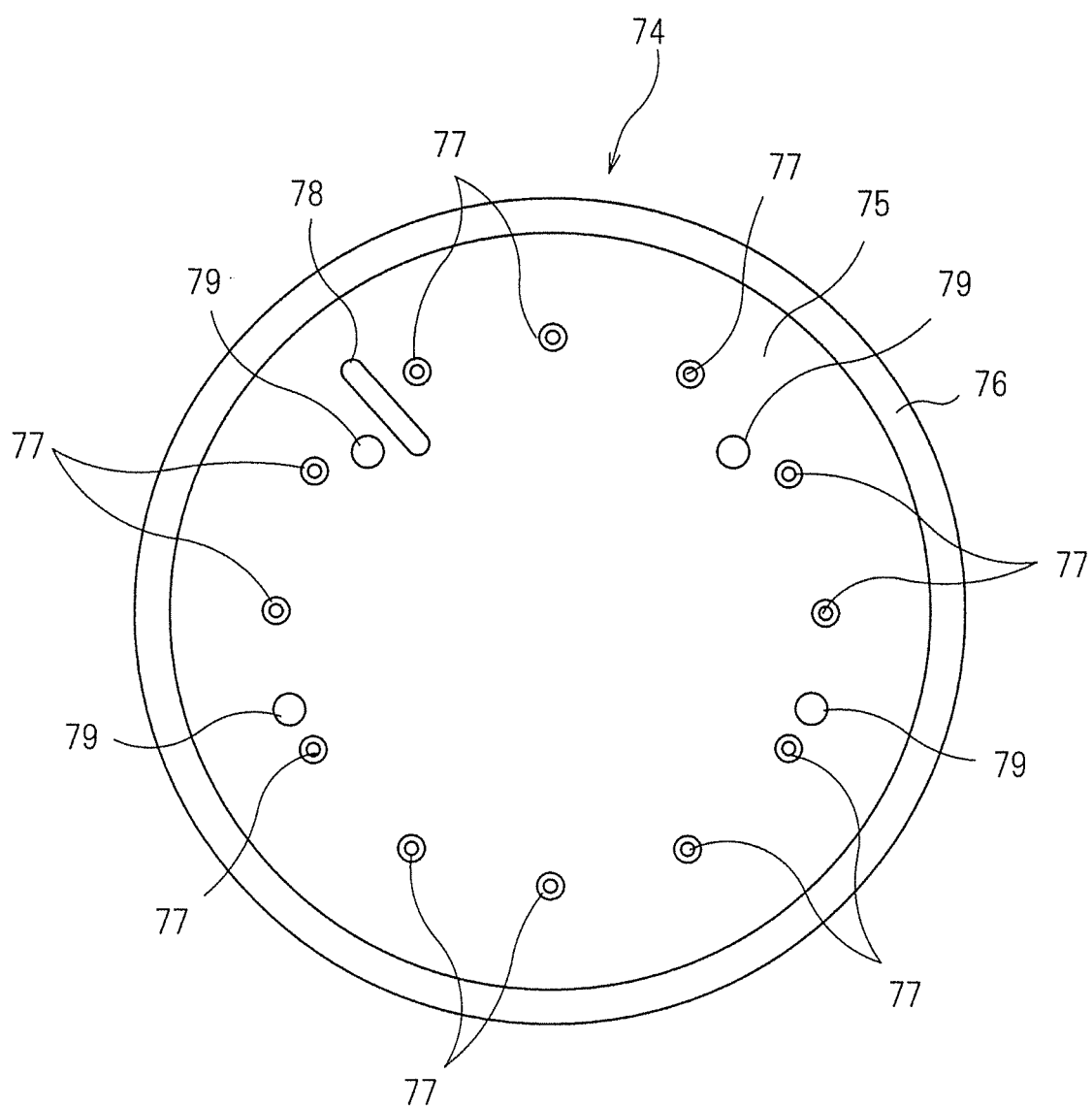
FIG. 3 is a plan view of a susceptor.

The susceptor 74 is supported by the four coupling portions 72 provided on the base ring 71. FIG. 3 is a plan view of the susceptor 74. FIG. 4 is a sectional view of the susceptor 74. The susceptor 74 includes a holding plate 75, a guide ring 76, and a plurality of substrate support pins 77. The holding plate 75 is a generally circular planar member made of quartz. The diameter of the holding plate 75 is greater than that of a semiconductor wafer W. In other words, the holding plate 75 has a size, as seen in plan view, greater than that of the semiconductor wafer W.

The guide ring 76 is provided on a peripheral portion of the upper surface of the holding plate 75. The guide ring 76 is an annular member having an inner diameter greater than the diameter of the semiconductor wafer W. For example, when the diameter of the semiconductor wafer W is 300 mm, the inner diameter of the guide ring 76 is 320 mm. The inner periphery of the guide ring 76 is in the form of a tapered surface that becomes wider in an upward direction from the holding plate 75. The guide ring 76 is made of quartz similar to that of the holding plate 75. The guide ring 76 may be welded to the upper surface of the holding plate 75 or fixed to the holding plate 75 with separately machined pins and the like. Alternatively, the holding plate 75 and the guide ring 76 may be machined as an integral member.

A region of the upper surface of the holding plate 75 which is inside the guide ring 76 serves as a planar holding surface 75a for holding the semiconductor wafer W. The substrate support pins 77 are provided upright on the holding surface 75a of the holding plate 75. In the present preferred embodiment, a total of 12 substrate support pins 77 are spaced at intervals of 30 degrees along the circumference of a circle concentric with the outer circumference of the holding surface 75a (the inner circumference of the guide ring 76). The diameter of the circle on which the 12 substrate support pins 77 are disposed (the distance between opposed ones of the substrate support pins 77) is slightly smaller than the diameter of the semiconductor wafer W, and is 270 mm to 280 mm (in the present preferred embodiment, 270 mm) when the diameter of the semiconductor wafer W is 300 mm. Each of the substrate support pins 77 is made of quartz. The substrate support pins 77 may be provided by welding on the upper surface of the holding plate 75 or machined integrally with the holding plate 75.

Referring again to FIG. 2, the four coupling portions 72 provided upright on the base ring 71 and the peripheral portion of the holding plate 75 of the susceptor 74 are rigidly secured to each other by welding. In other words, the susceptor 74 and the base ring 71 are fixedly coupled to each other with the coupling portions 72. The base ring 71 of such a holder 7 is supported by the wall surface of the chamber 6, whereby the holder 7 is mounted to the chamber 6. With the holder 7 mounted to the chamber 6, the holding plate 75 of the susceptor 74 assumes a horizontal attitude (an attitude such that the normal to the susceptor 74 coincides with a vertical direction). In other words, the holding surface 75a of the holding plate 75 becomes a horizontal plane.

A semiconductor wafer W transferred into the chamber 6 is placed and held in a horizontal attitude on the susceptor 74 of the holder 7 mounted to the chamber 6. At this time, the semiconductor wafer W is supported by the 12 substrate support pins 77 provided upright on the holding plate 75, and is held by the susceptor 74. More strictly speaking, the respective upper ends of the 12 substrate support pins 77 come in contact with the lower surface of the semiconductor wafer W to support the semiconductor wafer W. The semiconductor wafer W is supported in a horizontal attitude by the 12 substrate support pins 77 because the 12 substrate support pins 77 have a uniform height (distance from the upper end of the substrate support pin 77 to the holding surface 75a of the holding plate 75).

The semiconductor wafer W supported by the substrate support pins 77 is spaced a predetermined distance apart from the holding surface 75a of the holding plate 75. The thickness of the guide ring 76 is greater than the height of the substrate support pins 77. Thus, the guide ring 76 prevents the horizontal misregistration of the semiconductor wafer W supported by the substrate support pins 77.

As shown in FIGS. 2 and 3, an opening 78 is provided in the holding plate 75 of the susceptor 74 so as to extend vertically through the holding plate 75 of the susceptor 74. The opening 78 is provided for a radiation thermometer 120 (with reference to FIG. 1) to receive radiation (infrared radiation) emitted from the lower surface of the semiconductor wafer W. Specifically, the radiation thermometer 120 receives the radiation emitted from the lower-surface of the semiconductor wafer W through the opening 78, and a separately placed detector measures the temperature of the semiconductor wafer W. Further, the holding plate 75 of the susceptor 74 further includes four through holes 79 bored therein and designed so that lift pins 12 of the transfer mechanism 10 to be described later pass through the respective through holes 79, respectively, to transfer a semiconductor wafer W.

Figure 6:
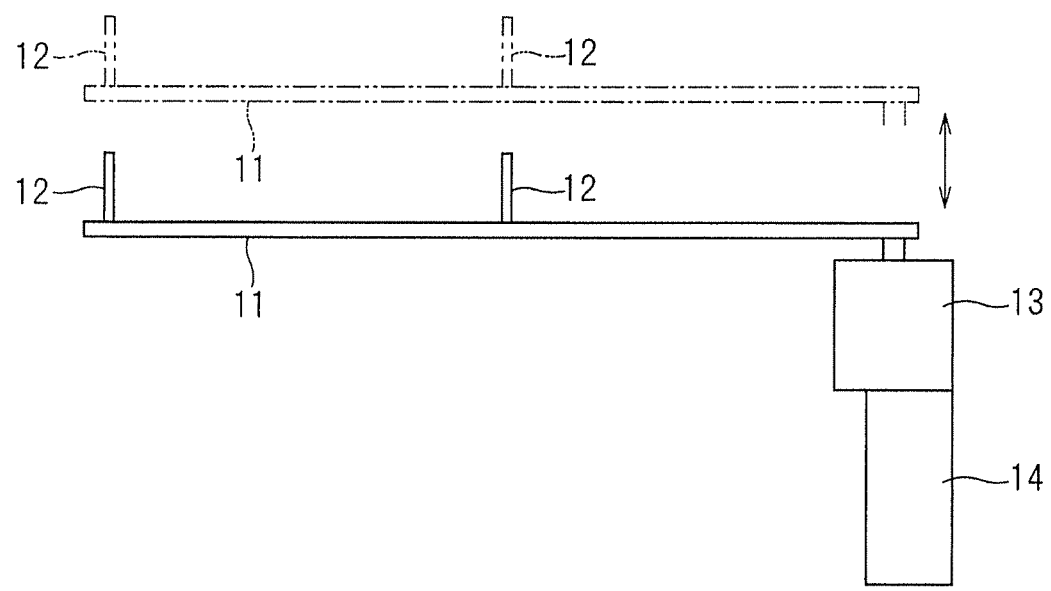
FIG. 6 is a side view of the transfer mechanism.

FIG. 5 is a plan view of a transfer mechanism 10. FIG. 6 is a side view of the transfer mechanism 10. The transfer mechanism 10 includes two transfer arms 11. The transfer arms 11 are of an arcuate configuration extending substantially along the annular recessed portion 62. Each of the transfer arms 11 includes the two lift pins 12 mounted upright thereon. The transfer arm 11 and the lift pin 12 are made of quartz. The transfer arms 11 are pivotable by a horizontal movement mechanism 13. The horizontal movement mechanism 13 moves the pair of transfer arms 11 horizontally between a transfer operation position (a position indicated by solid lines in FIG. 5) in which a semiconductor wafer W is transferred to and from the holder 7 and a retracted position (a position indicated by dash-double-dot lines in FIG. 5) in which the transfer arms 11 do not overlap the semiconductor wafer W held on the holder 7 as seen in plan view. The horizontal movement mechanism 13 may be of the type which causes individual motors to pivot the transfer arms 11 respectively or of the type which uses a linkage mechanism to cause a single motor to pivot the pair of transfer arms 11 in cooperative relation.

The pair of transfer arms 11 is moved upwardly and downwardly together with the horizontal movement mechanism 13 by an elevating mechanism 14. As the elevating mechanism 14 moves up the pair of transfer arms 11 at their transfer operation position, the four lift pins 12 in total pass through the respective four through holes 79 (with reference to FIGS. 2 and 3) bored in the susceptor 74 so that the upper ends of the lift pins 12 protrude from the upper surface of the susceptor 74. On the other hand, as the elevating mechanism 14 moves down the pair of transfer arms 11 in their transfer operation position to take the lift pins 12 out of the respective through holes 79 and the horizontal movement mechanism 13 moves the pair of transfer arms 11 so as to open the transfer arms 11, the transfer arms 11 move to their retracted position. The retracted position of the pair of transfer arms 11 is immediately over the base ring 71 of the holder 7. The retracted position of the transfer arms 11 is inside the recessed portion 62 because the base ring 71 is placed on the bottom surface of the recessed portion 62. An exhaust mechanism (not shown) is also provided near the location where the drivers (the horizontal movement mechanism 13 and the elevating mechanism 14) of the transfer mechanism 10 are provided, and is configured to exhaust an atmosphere around the drivers of the transfer mechanism 10 to the outside of the chamber 6.

As shown in FIG. 1, three radiation thermometers 120, 130, and 140 are provided inside the chamber 6. As described above, the radiation thermometer 120 measures temperature of a semiconductor wafer W through the opening 78 provided in the susceptor 74. The radiation thermometer 130 measures temperature of the upper chamber window 63 by detecting infrared light emitted through the upper chamber window 63. Meanwhile, the radiation thermometer 140 measures temperature of the lower chamber window 64 by detecting infrared light emitted through the lower chamber window 64.

The flash heating unit 5 provided over the chamber 6 includes an enclosure 51, a light source provided inside the enclosure 51 and including the multiple (in the present preferred embodiment, 30) xenon flash lamps FL, and a reflector 52 provided inside the enclosure 51 so as to cover the light source from above. The flash heating unit 5 further includes a lamp light radiation window 53 mounted to the bottom of the enclosure 51. The lamp light radiation window 53 forming the floor of the flash heating unit 5 is a plate-like quartz window made of quartz. The flash heating unit 5 is provided over the chamber 6, whereby the lamp light radiation window 53 is opposed to the upper chamber window 63. The flash lamps FL direct flashes of light from over the chamber 6 through the lamp light radiation window 53 and the upper chamber window 63 toward the heat treatment space 65.

The flash lamps FL, each of which is a rod-shaped lamp having an elongated cylindrical shape, are arranged in a plane so that the longitudinal directions of the respective flash lamps FL are in parallel with each other along a main surface of a semiconductor wafer W held by the holder 7 (that is, in a horizontal direction). Thus, a plane defined by the arrangement of the flash lamps FL is also a horizontal plane.

The xenon flash lamp FL includes a rod-shaped glass tube (discharge tube) containing xenon gas sealed therein and having positive and negative electrodes provided on opposite ends thereof, the electrodes being connected to a capacitor, and a trigger electrode attached to the outer peripheral surface of the glass tube. A xenon gas is electrically insulated, so that no electricity flows in the glass tube in a normal state even if electric charges are accumulated in the capacitor. However, when high voltage is applied to the trigger electrode to produce an electrical breakdown, electricity accumulated in the capacitor flows momentarily in the glass tube, and then xenon atoms or molecules are excited to cause light emission. In the xenon flash lamp FL as described above, electrostatic energy preliminarily accumulated in the capacitor is converted into an extremely short optical pulse of 0.1 milliseconds to 100 milliseconds, so that it has a feature capable of emitting extremely intensive light as compared with a light source of continuous lighting like the halogen lamp HL. That is, the flash lamp FL is a pulse emission lamp that instantaneously emits light in an extremely short time of less than one second. The flash lamp FL has a light emission time that can be adjusted by changing a coil constant of a lamp power source that supplies electric power to the flash lamp FL.

The reflector 52 is provided over the plurality of flash lamps FL so as to cover all of the flash lamps FL. The reflector 52 has a fundamental function of reflecting flashes of light emitted from the plurality of flash lamps FL toward the heat treatment space 65. The reflector 52 is a plate made of an aluminum alloy, and has a surface (a surface facing the flash lamps FL) that is roughened by abrasive blasting.

The halogen heating unit 4 provided under the chamber 6 includes an enclosure 41 incorporating the multiple (in the present preferred embodiment, 40) halogen lamps HL. The halogen heating unit 4 is a light irradiator that direct light from under the chamber 6 through the lower chamber window 64 toward the heat treatment space 65 to heat the semiconductor wafer W by means of the halogen lamps HL. Providing the halogen heating unit 4 under the chamber 6 allows the plurality of halogen lamps HL to face the lower chamber window 64.

FIG. 7 is a plan view showing a placement of the multiple halogen lamps HL. The 40 halogen lamps HL are arranged in two tiers, i.e. upper and lower tiers. That is, 20 halogen lamps HL are arranged in the upper tier closer to the holder 7, and 20 halogen lamps HL are arranged in the lower tier farther from the holder 7 than the upper tier. Each of the halogen lamps HL is a rod-shaped lamp having an elongated cylindrical shape. The 20 halogen lamps HL in the upper tier and the 20 halogen lamps HL in the lower tier are arranged so that the longitudinal directions thereof are in parallel with each other along a main surface of a semiconductor wafer W held by the holder 7 (that is, in a horizontal direction). Thus, a plane defined by the arrangement of the halogen lamps HL in each of the upper and lower tiers is also a horizontal plane.

As shown in FIG. 7, the halogen lamps HL in each of the upper and lower tiers are disposed at a higher density in a region opposed to the peripheral portion of the semiconductor wafer W held by the holder 7 than in a region opposed to the central portion thereof. In other words, the halogen lamps HL in each of the upper and lower tiers are arranged at shorter intervals in the peripheral portion of the lamp arrangement than in the central portion thereof. This allows a greater amount of light to impinge upon the peripheral portion of the semiconductor wafer W where a temperature decrease is prone to occur when the semiconductor wafer W is heated by the irradiation thereof with light from the halogen heating unit 4.

The group of halogen lamps HL in the upper tier and the group of halogen lamps HL in the lower tier are arranged to intersect each other in a lattice pattern. In other words, the 40 halogen lamps HL in total are disposed so that the longitudinal direction of the 20 halogen lamps HL arranged in the upper tier and the longitudinal direction of the 20 halogen lamps HL arranged in the lower tier are orthogonal to each other.

Each of the halogen lamps HL is a filament-type light source that passes current through a filament disposed in a glass tube to make the filament incandescent, thereby emitting light. A gas prepared by introducing a halogen element (iodine, bromine, and the like) in trace amounts into an inert gas such as nitrogen, argon, and the like is sealed in the glass tube. The introduction of the halogen element allows the temperature of the filament to be set at a high temperature while suppressing a break in the filament. Thus, the halogen lamps HL have the properties of having a longer life than typical incandescent lamps and being capable of continuously emitting intense light. That is, the halogen lamp HL is a continuous lighting lamp that continuously emits light for not less than one second. In addition, the halogen lamps HL, which are rod-shaped lamps, have a long life. The arrangement of the halogen lamps HL in a horizontal direction provides good efficiency of radiation toward the semiconductor wafer W provided over the halogen lamps HL.

A reflector 43 is provided also inside the enclosure 41 of the halogen heating unit 4 under the halogen lamps HL arranged in two tiers (with reference to FIG. 1). The reflector 43 reflects light emitted from the halogen lamps HL toward the heat treatment space 65.

The controller 3 controls the aforementioned various operating mechanisms provided in the heat treatment apparatus 1. The controller 3 is similar in hardware configuration to a typical computer. Specifically, the controller 3 includes a CPU that is a circuit for performing various computation processes, a ROM or read-only memory for storing a basic program therein, a RAM or readable-writable memory for storing various pieces of information therein, and a magnetic disk for storing control software, data, and the like therein. The CPU in the controller 3 executes a predetermined processing program, whereby processes in the heat treatment apparatus 1 proceed.

The heat treatment apparatus 1 further includes, in addition to the aforementioned components, various cooling structures to prevent an excessive temperature rise in the halogen heating unit 4, the flash heating unit 5, and the chamber 6 because of the heat energy generated from the halogen lamps HL and the flash lamps FL during the heat treatment of a semiconductor wafer W. As an example, a water cooling tube (not shown) is provided in the walls of the chamber 6. In addition, the halogen heating unit 4 and the flash heating unit 5 have an air cooling structure for forming a gas flow therein to exhaust heat. Air is supplied to a gap between the upper chamber window 63 and the lamp light radiation window 53 to cool down the flash heating unit 5 and the upper chamber window 63.

Next, treatment operation in the heat treatment apparatus 1 will be described. First, a normal heat treatment procedure for a semiconductor wafer W to be treated will be described. The semiconductor wafer W to be treated is a semiconductor substrate into which impurities (ions) are added by an ion implantation method. The impurities are activated by heating treatment (annealing) by emission of a flash of light, performed by the heat treatment apparatus 1. The treatment procedure for a semiconductor wafer W, described below, proceeds under control of the controller 3 over each operating mechanism of the heat treatment apparatus 1.

First, the valve 84 for air supply is opened, and the valves 89 and 192 for exhaust are opened to start ventilation in the chamber 6. When the valve 84 is opened, nitrogen gas is supplied into the heat treatment space 65 through the gas supply opening 81. In addition, when the valve 89 is opened, gas in the chamber 6 is exhausted through the gas exhaust opening 86. This causes the nitrogen gas supplied from an upper portion of the heat treatment space 65 of the chamber 6 to flow downwardly and then to be exhausted from a lower portion of the heat treatment space 65.

The gas within the chamber 6 is exhausted also through the transport opening 66 by opening the valve 192. Further, the exhaust mechanism (not shown) exhausts an atmosphere near the drivers of the transfer mechanism 10. When heat treatment is applied to the semiconductor wafer W in the heat treatment apparatus 1, nitrogen gas is continuously supplied into the heat treatment space 65. The amount of the supply is appropriately changed depending on a treatment step.

Subsequently, the gate valve 185 is opened to open the transport opening 66. A transfer robot outside the heat treatment apparatus 1 transfers a semiconductor wafer W to be treated into the heat treatment space 65 of the chamber 6 through the transport opening 66. While at this time, an atmosphere outside the apparatus may be sucked when the semiconductor wafer W is transferred, nitrogen gas being continuously supplied into the chamber 6 flows out through the transport opening 66 to enable reduction in suction of an external atmosphere as much as possible.

The semiconductor wafer W transferred into the heat treatment space 65 by the transfer robot is moved forward to a position lying immediately over the holder 7 and is stopped thereat. Then, the pair of transfer arms 11 of the transfer mechanism 10 is moved horizontally from the retracted position to the transfer operation position and is then moved upward, whereby the lift pins 12 pass through the through holes 79 and protrude from the upper surface of the holding plate 75 of the susceptor 74 to receive the semiconductor wafer W. At this time, the lift pins 12 move upward to the position above the upper ends of the substrate support pins 77.

After the semiconductor wafer W is placed on the lift pins 12, the transfer robot moves out of the heat treatment space 65, and the gate valve 185 closes the transport opening 66. Then, the pair of transfer arms 11 moves downwardly to transfer the semiconductor wafer W from the transfer mechanism 10 to the susceptor 74 of the holder 7, so that the semiconductor wafer W is held from below in a horizontal attitude from below. The semiconductor wafer W is supported by the substrate support pins 77 provided upright on the holding plate 75, and is held by the susceptor 74. The semiconductor wafer W is held by the holder 7 in such an attitude that the front surface thereof into which impurities are implanted by pattern formation is the upper surface. A predetermined distance is defined between the back surface (a main surface opposite from the front surface) of the semiconductor wafer W supported by the substrate support pins 77 and the holding surface 75a of the holding plate 75. The pair of transfer arms 11 moved downwardly below the susceptor 74 is retracted to the retracted position, i.e. to the inside of the recessed portion 62, by the horizontal movement mechanism 13.

The semiconductor wafer W is held from below by the susceptor 74 made of quartz of the holder 7 in a horizontal attitude, and then the 40 halogen lamps HL of the halogen heating unit 4 light up all together to start preliminary heating (assist heating). Halogen light emitted from the halogen lamps HL is transmitted through the lower chamber window 64 and the susceptor 74 both made of quartz, and impinges upon the lower surface of the semiconductor wafer W. When light irradiation from the halogen lamps HL is received, the semiconductor wafer W is preliminary heated to be increased in temperature. It should be noted that the transfer arms 11 of the transfer mechanism 10, which are retracted to the inside of the recessed portion 62, and thus do not become an obstacle to the heating using the halogen lamps HL.

The radiation thermometer 120 measures temperature of the semiconductor wafer W when the halogen lamps HL perform the preliminary heating. Specifically, the radiation thermometer 120 receives infrared radiation emitted from the lower surface of the semiconductor wafer W held by the susceptor 74 through the opening 78 to measure temperature of the semiconductor wafer W increasing in temperature. The measured temperature of the semiconductor wafer W is transmitted to the controller 3. The controller 3 controls the output from the halogen lamps HL while monitoring whether the temperature of the semiconductor wafer W increasing in temperature by the irradiation with light from the halogen lamps HL reaches a predetermined preliminary heating temperature T1 or not. In other words, the controller 3 effects feedback control of the output from the halogen lamps HL so that the temperature of the semiconductor wafer W is equal to the preliminary heating temperature T1, based on the value measured with the radiation thermometer 120. The preliminary heating temperature T1 is set to a temperature within a range from 200° C. to 800° C., preferably from 350° C. to 600° C., where impurities added to the semiconductor wafer W may not be diffused by heat (600° C. in the present preferred embodiment).

After the temperature of the semiconductor wafer W reaches the preliminary heating temperature T1, the controller 3 maintains the temperature of the semiconductor wafer W at the preliminary heating temperature T1 for a while. Specifically, when the temperature of the semiconductor wafer W measured with the radiation thermometer 120 reaches the preliminary heating temperature T1, the controller 3 controls the output from the halogen lamps HL to maintain the temperature of the semiconductor wafer W at approximately the preliminary heating temperature T1.

At the time when a predetermined time elapses after temperature of a semiconductor wafer W held on the susceptor 74 reaches a preliminary heating temperature T1, the flash lamps FL of the flash heating unit 5 irradiates a front surface of the semiconductor wafer W with a flash of light. At this time, a part of a flash of light emitted from each of the flash lamps FL directly radiates into the chamber 6, and the other thereof radiates into the chamber 6 after being reflected once by the reflector 52, and then flash heating of the semiconductor wafer W is performed by emission of these flashes of light.

The flash heating is performed by emission of a flash of light from each of the flash lamps FL, so that front surface temperature of the semiconductor wafer W can be increased in a short time. In other words, a flash of light emitted from each of the flash lamps FL is an extremely-short and intensive flash acquired by converting electrostatic energy preliminarily accumulated in a capacitor into an extremely short optical pulse of the order of irradiation time of not less than 0.1 milliseconds and not more than 100 milliseconds. Then, front surface temperature of the semiconductor wafer W irradiated with a flash of light from each of the flash lamps FL for flash heating momentarily increases to a treatment temperature T2 of 1000° C. or more, and rapidly decreases after impurities implanted into the semiconductor wafer W are activated. As described above, the heat treatment apparatus 1 can increase and decrease front surface temperature of the semiconductor wafer W in an extremely short time, so that impurities implanted into the semiconductor wafer W can be activated while diffusion of the impurities is suppressed. A time required for activation of the impurities is extremely short as compared with a time required for thermal diffusion thereof, so that the activation is completed even in a short time of the order of from 0.1 milliseconds to 100 milliseconds, where no diffusion occurs.

After flash heating treatment is finished, the halogen lamps HL each are tuned off after elapse of a predetermined time. This causes the semiconductor wafer W to sharply decrease in temperature from the preliminary heating temperature T1. The radiation thermometer 120 measures the temperature of the semiconductor wafer W decreasing in temperature, and a result of measurement is transmitted to the controller 3. The controller 3 monitors whether the temperature of the semiconductor wafer W is decreased to a predetermined temperature on the basis of the result of measurement with the radiation thermometer 120 or not. After the temperature of the semiconductor wafer W is decreased to the predetermined temperature or below, the pair of transfer arms 11 of the transfer mechanism 10 is moved horizontally again from the retracted position to the transfer operation position and is then moved upwardly, so that the lift pins 12 protrude from the upper surface of the susceptor 74 to receive the heat-treated semiconductor wafer W from the susceptor 74. Subsequently, the transport opening 66 which has been closed is opened by the gate valve 185, and the transfer robot outside the heat treatment apparatus 1 transfers the semiconductor wafer W placed on the lift pins 12 to the outside. Then, the heat treatment apparatus 1 completes the heating treatment of the semiconductor wafer W.

Typically, treatment of a semiconductor wafer W is performed per lot. One lot is a set of semiconductor wafers W to be subjected to the same treatment under the same conditions. Also in the heat treatment apparatus 1 of the present preferred embodiment, a plurality of (e.g., 25) semiconductor wafers W constituting one lot are sequentially transferred into the chamber 6 one by one to be subjected to heating treatment.

When the heat treatment apparatus 1 in which treatment has not been performed for a while starts treatment of one lot, the first semiconductor wafer W of the lot is transferred into the chamber 6 at approximately room temperature to be subjected to flash heating treatment. Such a case includes a case where the first lot after the heat treatment apparatus 1 is started after maintenance is performed, and a case where a long time has elapsed after the previous lot was treated, for example. During the heating treatment, heat conduction occurs from the semiconductor wafer W increased in temperature to a structure inside the chamber, such as the susceptor 74, so that the susceptor 74 initially at room temperature gradually increases in temperature due to heat accumulation as the number of treated semiconductor wafers W increases. A part of infrared light emitted from the halogen lamps HL is absorbed by the lower chamber window 64, so that temperature of the lower chamber window 64 also gradually increases as the number of treated semiconductor wafers W increases.

When the heating treatment is applied to about ten semiconductor wafers W, temperature of each of the susceptor 74 and the lower chamber window 64 reaches a constant stable temperature. In the susceptor 74 having reached the stable temperature, the amount of heat transfer from the semiconductor wafer W to the susceptor 74 and the amount of heat radiation from the susceptor 74 are balanced. The amount of heat transfer from the semiconductor wafer W is more than the amount of heat radiation from the susceptor 74 until temperature of the susceptor 74 reaches the stable temperature, so that the temperature of the susceptor 74 gradually increases due to heat accumulation as the number of treated semiconductor wafers W increases. In contrast, the amount of heat transfer from the semiconductor wafer W is balanced with the amount of heat radiation from the susceptor 74 after the temperature of the susceptor 74 reaches the stable temperature, so that the temperature of the susceptor 74 is maintained at a constant stable temperature. In addition, the amount of heat absorbed by the lower chamber window 64 from irradiation light of the halogen lamps HL and the amount of heat radiation from the lower chamber window 64 are balanced after the temperature of the lower chamber window 64 reaches the stable temperature, so that the temperature of the lower chamber window 64 is also maintained at a constant stable temperature.

When treatment is started in the chamber 6 at room temperature as described above, there is a problem that temperature histories become uneven due to a difference in temperature of the structure of the chamber 6 between an initial semiconductor wafer W of the lot and the semiconductor wafer W in the middle of the lot. In addition, an initial semiconductor wafer W is subjected to flash heating treatment while being supported by the susceptor 74 at low temperature, so that wafer warpage may occur. For this reason, dummy running is conventionally performed as described above before treatment of the lot is started such that a dummy wafer to be untreated is transferred into the chamber 6 to be subjected to the same preliminary heating and flash heating treatment as a semiconductor wafer W to be treated to increase temperature of a structure inside the chamber, such as the susceptor 74 and the lower chamber window 64, to a stable temperature. As described above, such dummy running inhibits efficient operation of the heat treatment apparatus 1.

Figure 8:
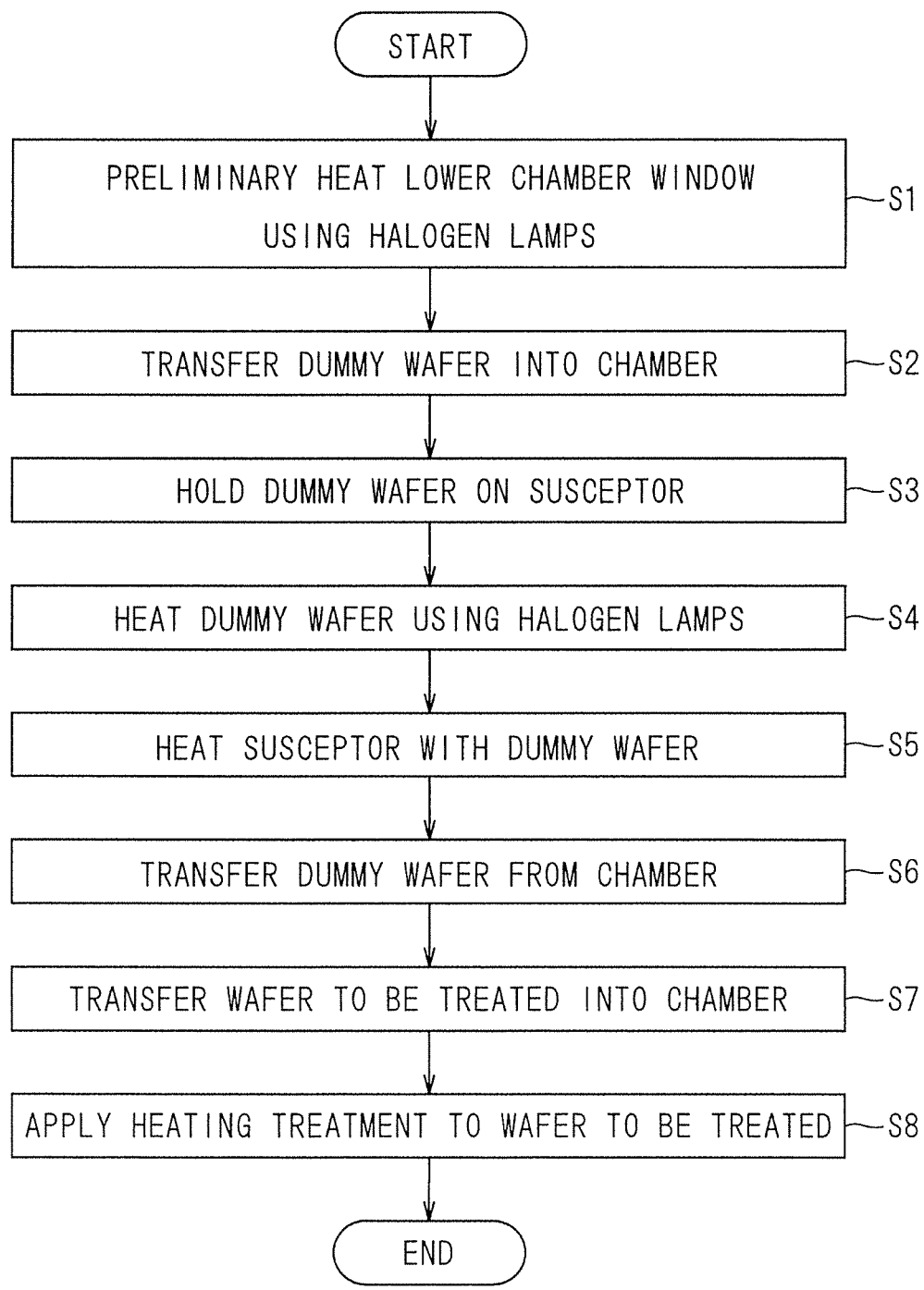
FIG. 8 is a flowchart showing a treatment procedure of a heat treatment method according to the present invention.

Thus, in the present preferred embodiment, the lower chamber window 64 and the susceptor 74 are preliminary heated before a semiconductor wafer W to be treated is transferred into the chamber 6. FIG. 8 is a flowchart showing a treatment procedure of a heat treatment method according to the present invention.

First, after treatment of the preceding lot is completed, or after the heat treatment apparatus 1 is started after maintenance, for example, the lower chamber window 64 is preliminary heated by the halogen lamps HL (step S1). FIG. 9 is a schematic diagram showing heating of the lower chamber window 64 by the halogen lamps HL. There is no semiconductor wafer W in the chamber 6, and nothing is held on the susceptor 74. That is, the halogen lamps HL are lit in a state where the inside of the chamber 6 is empty, and light is emitted toward the chamber 6.

The halogen lamps HL mainly emit infrared light, and light having a wavelength of about 4 µm to 5 µm or more in the infrared light is absorbed by the lower chamber window 64 made of quartz. Absorbing of a part of the infrared light emitted from the halogen lamp HL causes the lower chamber window 64 to be heated and increased in temperature. The radiation thermometer 140 measures temperature of the lower chamber window 64 increased in temperature. The radiation thermometer 140 transmits the measured temperature of the lower chamber window 64 to the controller 3. The controller 3 effects feedback control of output from the halogen lamps HL based on a measurement value from the radiation thermometer 140 so that temperature of the lower chamber window 64 becomes a stable temperature TS 1 (first stable temperature). The stable temperature TS1 is a temperature of the chamber window 64 at the time when temperature of the lower chamber window 64 is increased to reach a constant stable state after the heating treatment is continuously applied to ten or more semiconductor wafers W in one lot. Then, the controller 3 controls the output of the halogen lamps HL so that the temperature of the lower chamber window 64 is maintained at the stable temperature TS1. That is, the lower chamber window 64 is kept warm by light irradiation from the halogen lamps HL so as to be maintained at the stable temperature TS1.

Next, before a semiconductor wafer W to be treated first of a new lot is transferred into the chamber 6, a dummy wafer DW is transferred into the chamber 6 (step S2). The dummy wafer DW is a disk-shaped silicon wafer similar to the semiconductor wafer W, and has a size and a shape similar to those of the semiconductor wafer W. However, pattern formation and ion implantation are not applied to the dummy wafer DW.

A procedure for transferring the dummy wafer DW into the chamber 6 is the same as the above-described procedure for transferring the semiconductor wafer W thereinto. That is, the transfer robot outside the apparatus transfers the dummy wafer DW into the chamber 6, and the lift pins 12 of the transfer mechanism 10 receive the dummy wafer DW. Then, the lift pins 12 descend to allow the dummy wafer DW to be held on the susceptor 74 (step S3).

At this time, the halogen lamps HL are continuously lit, and the dummy wafer DW held on the susceptor 74 is heated by the halogen lamps HL (step S4). FIG. 10 is a schematic diagram showing the heating of the dummy wafer DW by the halogen lamps HL. The dummy wafer DW is held on the quartz susceptor 74. Light within a range of wavelengths having passed through the quartz lower chamber window 64 of light emitted from the halogen lamps HL directly passes through the quartz susceptor 74, and irradiates a lower surface of the quartz susceptor DW. When light irradiation from the halogen lamps HL is received, the dummy wafer DW is heated to be increased in temperature. Then, the susceptor 74 is heated by heat conduction and heat radiation from the dummy wafer DW increased in temperature (step S5).

The dummy wafer DW is held on the susceptor 74 while being supported by a plurality of substrate support pins 77 provided upright on the holding plate 75 of the susceptor 74. Heat conduction occurs from the dummy wafer DW increased in temperature to the susceptor 74 via the plurality of substrate support pins 77 to heat the susceptor 74. In addition, a slight clearance is formed between the lower surface of the dummy wafer DW supported by the plurality of substrate support pins 77 and the holding surface 75a of the holding plate 75, and the susceptor 74 is also heated by heat radiation from the lower surface of the dummy wafer DW through the clearance.

At this time, the susceptor 74 is heated by the dummy wafer DW so that temperature of the susceptor 74 reaches a stable temperature TS2 (second stable temperature). The stable temperature TS2 is a temperature of the susceptor 74 at the time when temperature of the susceptor 74 is increased to reach a constant stable state after the heating treatment is continuously applied to ten or more semiconductor wafers W in one lot. Specifically, output of the halogen lamps HL, enabling the dummy wafer DW to be heated to temperature necessary for increasing temperature of the susceptor 74 to the stable temperature TS2, is preliminarily obtained by experiment or simulation, and is set in the controller 3. Then, the output of the halogen lamp HL is adjusted to the setting output under control of the controller 3. As a result, the dummy wafer DW is heated to a predetermined temperature by light irradiation from the halogen lamps HL, and the susceptor 74 is preliminary heated to the stable temperature TS2 by the dummy wafer DW.

As a result of changing the output of the halogen lamps HL, from that at the time of keeping temperature of the lower chamber window 64, to heat the dummy wafer DW, the temperature of the lower chamber window 64, which is maintained at the stable temperature TS1, also may change from the stable temperature TS1. However, the lower chamber window 64 has a heat capacity remarkably larger than that of the susceptor 74 (in the present preferred embodiment, while the susceptor has a thickness of about 2 mm, the lower chamber window 64 has a thickness of 28 mm). Thus, even if the output of the halogen lamps HL is changed for a short time to heat the dummy wafer DW, the temperature of the lower chamber window 64 does not change largely and is maintained substantially at the stable temperature TS1.

After the susceptor 74 is preliminary heated to the stable temperature TS2 by the dummy wafer DW, the dummy wafer DW is transferred from the chamber 6 (step S6). A procedure for transferring the dummy wafer DW from the chamber 6 is the same as the above-described procedure for transferring the semiconductor wafer W therefrom. That is, the lift pins 12 are raised to receive a dummy wafer DW from the susceptor 74, and the dummy wafer DW is transferred from the chamber 6 by the transfer robot outside the apparatus.

After the dummy wafer DW is transferred from the chamber 6, a semiconductor wafer W to be treated first of the lot is immediately transferred into the chamber 6, and is held on the susceptor 74 (step S7). Then, the heating treatment is applied to the semiconductor wafer W to be treated according to the above-described treatment procedure (step S8).

In the present preferred embodiment, first, the lower chamber window 64 is maintained at the stable temperature TS1 by light irradiation from the halogen lamps HL while nothing is held on the susceptor 74. Immediately before a semiconductor wafer W to be treated is transferred into the chamber 6, the dummy wafer DW is held on the susceptor 74. Then, the dummy wafer DW is heated by light irradiation from the halogen lamp HL to preliminary heat the susceptor 74 to the stable temperature TS2. That is, while the halogen lamps HL are used as a single heat source, the lower chamber window 64 and the susceptor 74 of two structures in the chamber are heated in two steps. When the susceptor 74 is heated, a dummy wafer DW is held on the susceptor 74 to serve as a medium for indirectly heating the susceptor 74 by light irradiation from the halogen lamps HL. It is difficult to heat the susceptor 74 merely by adjusting the output of the halogen lamps HL without using the dummy wafer DW. This is because light within a range of wavelengths that can be absorbed by the quartz susceptor 74 in infrared light emitted from the halogen lamps HL is first absorbed by the lower chamber window 64 made of quartz. Conversely, the dummy wafer DW absorbs infrared light within a range of wavelengths having passed through quartz in light emitted from the halogen lamps HL to increase in temperature.

Heating structures in the chamber 6 in two steps allows the lower chamber window 64 and the susceptor 74 to be heated to the stable temperatures TS1 and TS2, respectively, when a semiconductor wafer W to be first treated of one lot is transferred into the chamber 6. As a result, the lower chamber window 64 and the susceptor 74 each have the same temperature over all semiconductor wafers W constituting the lot, so that temperature histories can be made uniform. In addition, an initial semiconductor wafer W of the lot is held on the susceptor 74 heated to the stable temperature TS2, so that wafer warpage caused by a temperature difference between the susceptor 74 and the semiconductor wafer W can be prevented. As a result, it is possible to eliminate dummy running for applying heating treatment, similar to that for an actual semiconductor wafer W, to a plurality (ten or more) of dummy wafers as in the prior art, so that efficient operation of the substrate treatment apparatus 1 can be achieved.

While the preferred embodiment according to the present invention has been described above, various modifications of the present invention in addition to it described above may be made without departing from the scope and spirit of the invention. For example, while the susceptor 74 is indirectly heated by light irradiation from the halogen lamps HL using the dummy wafer DW as a medium in the above preferred embodiment, the present invention is not limited to this, and thus a plate-shaped body that increases in temperature by absorbing infrared light may be used instead of the dummy wafer DW. For example, a substrate made of silicon carbide (SiC) may be held on the susceptor 74. That is, it suffices if the susceptor 74 holds an object to be heated, increasing in temperature by absorbing infrared light, instead of the dummy wafer DW. However, light having wavelengths of 4 μm to 5 μm or more, in infrared light emitted from the halogen lamp HL, is absorbed by the lower chamber window 64, so that the object to be heated needs to be formed of a member that absorbs infrared light having a wavelength less than 4 μm that passes through the lower chamber window 64.

While the 30 flash lamps FL are provided in the flash heating unit 5 in the above preferred embodiment, the present invention is not limited to this, and any number of flash lamps FL may be provided. The flash lamps FL are not limited to the xenon flash lamps, and may be krypton flash lamps. The number of halogen lamps HL provided in the halogen heating unit 4 is also not limited to 40, and any number of halogen lamps HL may be provided.

In the above preferred embodiment, while the filament-type halogen lamps HL each are used as a continuous lighting lamp that emits light continuously for not less than one second to preliminary heat a semiconductor wafer W, the present invention is not limited to this, and an arc lamp of a discharge type may be used as a continuous lighting lamp in place of the halogen lamp HL to perform preliminary heating or the like of a semiconductor wafer W, heating of the lower chamber window 64, and heating of a dummy wafer DW.

A substrate to be treated by the heat treatment apparatus 1 is not limited to a semiconductor wafer, and may be a glass substrate to be used for a flat panel display such as a liquid crystal display device, and a substrate for a solar cell. The art according to the present invention may be applicable for heat treatment for a high-permittivity gate insulating film (High-k film), joining between metal and silicon, and crystallization of polysilicon.

In addition, the heat treatment technique according to the present invention is not limited to a flash lamp annealing apparatus, and is also applicable to an apparatus using a heat source other than a flash lamp, such as a single wafer type lamp annealing apparatus and a CVD apparatus, using a halogen lamp. Particularly, the technique according to the present invention can be suitably applied to a backside annealing apparatus in which a halogen lamp is disposed under a chamber and heat treatment is performed by irradiating a back surface of a semiconductor wafer with light. The halogen lamp may be disposed above the chamber. In this case, an upper chamber window is maintained at a stable temperature by the halogen lamp.

While the invention has been shown and described in detail, the foregoing description is in all aspects illustrative and not restrictive. It is therefore understood that numerous modifications and variations can be devised without departing from the scope of the invention.

What is claimed is:

1. A heat treatment method for irradiating a substrate held on a quartz susceptor provided in a chamber with light from a continuous lighting lamp provided outside said chamber to heat the substrate, the heat treatment method comprising the steps of:
   (a) keeping temperature of a quartz window provided in said chamber by light irradiation from said continuous lighting lamp;
   (b) holding an object to be heated that absorbs infrared light to increase in temperature on said susceptor before a substrate to be treated is transferred into said chamber so that said object to be heated is heated by light irradiation from said continuous lighting lamp to preliminary heat said susceptor; and
   (c) holding said substrate on said susceptor after said step (b) so that said substrate is heated by light irradiation from said continuous lighting lamp, wherein
   when temperature of each of said quartz window and said susceptor increases to be constant by continuously irradiating a plurality of substrates of one lot with light to heat the substrates without heating said quartz window and said susceptor, the temperature of said quartz window and the temperature of the susceptor are indicated as a first stable temperature and a second stable temperature, respectively,
   said quartz window is heated so that the temperature of said quartz window is maintained at said first stable temperature in said step (a), and said susceptor is heated so that the temperature of said susceptor reaches said second stable temperature in said step (b).

2. The heat treatment method according to claim 1, wherein
said object to be heated absorbs infrared light within a range of wavelengths having passed through said quartz window in light emitted from said continuous lighting lamp.

3. The heat treatment method according to claim 1, wherein
said step (c) includes a step of irradiating said substrate held on said susceptor with a flash of light from a flash tamp.

* * * * *

UNITED STATES PATENT AND TRADEMARK OFFICE
CERTIFICATE OF CORRECTION

PATENT NO. : 10,559,482 B2  
APPLICATION NO. : 15/907245  
DATED : February 11, 2020  
INVENTOR(S) : Yoshio Ito Page 1 of 1

It is certified that error appears in the above-identified patent and that said Letters Patent is hereby corrected as shown below:

On the Title Page

(30) Foreign Application Priority Data should read:  
Mar. 9, 2017     (JP)     2017-045053

Signed and Sealed this  
Nineteenth Day of May, 2020

Andrei Iancu  
*Director of the United States Patent and Trademark Office*